(12) United States Patent
Wei

(10) Patent No.: US 12,191,184 B2
(45) Date of Patent: Jan. 7, 2025

(54) FIXTURE

(71) Applicant: CHANGXIN MEMORY TECHNOLOGIES, INC., Hefei (CN)

(72) Inventor: Zhongyang Wei, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 430 days.

(21) Appl. No.: 17/647,986

(22) Filed: Jan. 14, 2022

(65) Prior Publication Data

US 2023/0023232 A1 Jan. 26, 2023

Related U.S. Application Data

(63) Continuation of application No. PCT/CN2021/106054, filed on Jul. 13, 2021.

(30) Foreign Application Priority Data

Jul. 7, 2021 (CN) .......................... 202110768871.8

(51) Int. Cl.
*H01L 21/683* (2006.01)
*H01L 21/67* (2006.01)

(52) U.S. Cl.
CPC .... *H01L 21/6833* (2013.01); *H01L 21/67023* (2013.01)

(58) Field of Classification Search
CPC ............. H01L 21/6831; H01L 21/6833; H01L 21/67023; H01L 21/68792
USPC ....................................................... 156/267
See application file for complete search history.

(56) References Cited

U.S. PATENT DOCUMENTS

| | | | |
|---|---|---|---|
| 10,391,526 B2 | 8/2019 | Avoyan et al. | |
| 10,835,919 B2 | 11/2020 | Ybarra et al. | |
| 10,991,570 B2 | 4/2021 | Chen et al. | |
| 2009/0180086 A1 | 7/2009 | Ryu et al. | |
| 2019/0201945 A1* | 7/2019 | Tokashiki | H01L 21/67028 |
| 2020/0055102 A1 | 2/2020 | Liu et al. | |

FOREIGN PATENT DOCUMENTS

| | | |
|---|---|---|
| CN | 1770388 A | 5/2006 |
| CN | 104707832 A | 6/2015 |
| CN | 107799454 A | 3/2018 |
| CN | 109524325 A | 3/2019 |
| CN | 110834011 A | 2/2020 |
| CN | 112435918 A | 3/2021 |

OTHER PUBLICATIONS

International Search Report cited in PCT/CN2021/106054 mailed Mar. 29, 2022, 9 pages.
First Office Action cited in CN202110768871.8, mailed Feb. 28, 2022, 15 pages.

* cited by examiner

*Primary Examiner* — James D Sells
(74) *Attorney, Agent, or Firm* — Syncoda LLC; Feng Ma

(57) ABSTRACT

The present disclosure relates to a fixture, the fixture is a fixture for a semiconductor etching machine, and the fixture includes: a support mechanism, configured to be arranged on an outer base of an electrostatic chuck of the semiconductor etching machine; a cleaning mechanism, being rotatably arranged on the support mechanism; and at least one cleaning unit, being arranged on the cleaning mechanism.

20 Claims, 5 Drawing Sheets

FIXTURE

CROSS-REFERENCE TO RELATED APPLICATIONS

The present disclosure is a continuation application of International Patent Application No. PCT/CN2021/106054, titled "A FIXTURE" and filed on Jul. 13, 2021, which claims the priority to Chinese Patent Application No. 202110768871.8, titled "A FIXTURE" and filed with the China National Intellectual Property Administration (CNIPA) on Jul. 7, 2021. The entire contents of International Patent Application No. PCT/CN2021/106054 and Chinese Patent Application No. 202110768871.8 are incorporated herein by reference.

TECHNICAL FIELD

The present disclosure relates to, but is not limited to, a fixture.

BACKGROUND

For semiconductor manufacturing devices, an electrostatic chuck (ESC) in a chamber, especially the edge part of the ESC needs cleaning and maintenance. After the maintenance of the chamber is completed by conducting the existing maintenance method, the edge flow is often high, resulting in the need to clean the chamber again or replace new parts, which prolongs the downtime of the equipment.

In the process of cleaning the chamber, it is operated rely on the feeling of the operator, which not only can not improve the above situation, but also may damage the parts due to the improper operation of the operator and increase the equipment cost.

SUMMARY

An embodiment of the present disclosure provides a fixture. The fixture is a fixture for a semiconductor etching machine, the fixture comprises:
- a support mechanism, configured to be arranged on an outer base of an electrostatic chuck of the semiconductor etching machine;
- a cleaning mechanism, being rotatably arranged on the support mechanism; and
- at least one cleaning unit, being arranged on the cleaning mechanism.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these drawings, similar reference numerals are used to indicate similar elements. The drawings in the following description are some embodiments of the present disclosure, but not all embodiments. For those skilled in the art, other drawings can be obtained from these drawings without any creative efforts.

DETAILED DESCRIPTION

A clear and complete description will be made to the technical solutions in the embodiments of the present disclosure below in combination with the drawings in the embodiments of the present disclosure. Apparently, the embodiments described are part of the embodiments of the present disclosure, not all of them. All other embodiments obtained by those skilled in the art based on the embodiments of the present disclosure without any creative efforts shall fall within the protection scope of the present disclosure. It should be noted that the embodiments in the present disclosure and the features in the embodiments can be combined with each other on a non-conflict basis.

The present disclosure provides a fixture, configured to clean and correct the electrostatic chuck of a semiconductor etching machine. A support mechanism of the fixture is fixed on the outer base of the electrostatic chuck. The fixture is centered and aligned by the original equipment structure of the semiconductor etching machine. And the cleaning unit arranged on the cleaning mechanism is driven to rotate when the cleaning mechanism rotates along the support mechanism. During the rotation, the cleaning unit cleans the electrostatic chuck. The fixture provided by the present disclosure can replace manual operation, ensure unity and uniformity of the operation, avoid damage of parts caused by improper manual operation, and reduce the replacement of parts, which can save production costs, improve cleaning efficiency, reduce downtime of the equipment due to cleaning and maintenance or replacement of parts, and improve the normal operation time of the equipment, thereby improve production efficiency.

The fixture provided by the present disclosure is described below in combination with the accompanying drawings and specific embodiments.

Figure 1:
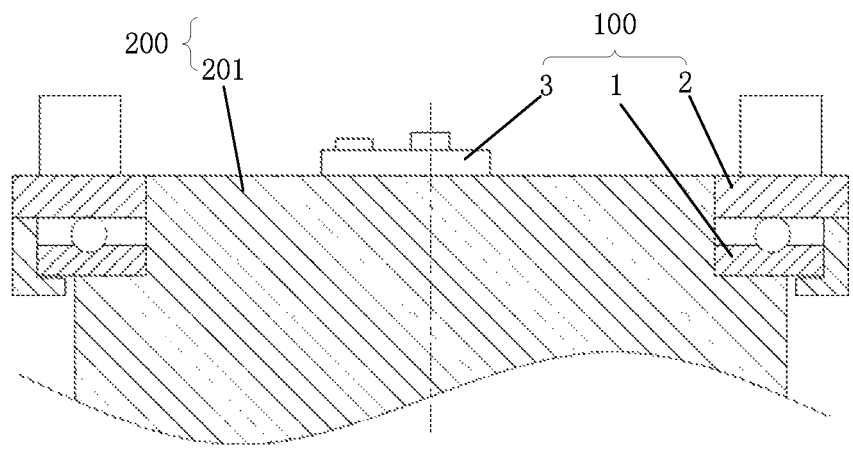
FIG. 1 is a schematic diagram of a use state of a fixture provided by an exemplary embodiment.

FIG. 1 is a schematic diagram of a use state of the fixture of the present disclosure according to an exemplary embodiment. Referring to FIG. 1, the fixture 100 of the present disclosure is a fixture 100 for a semiconductor etching machine 200. The fixture 100 includes: a support mechanism 1, a cleaning mechanism 2 and at least one cleaning unit 3; wherein the support mechanism 1 is configured to be arranged on the outer base of the electrostatic chuck 201 of the semiconductor etching machine 200 to fix the fixture 100 when in use so as to realize the positioning of the fixture 100 on the semiconductor etching machine 200; the cleaning mechanism 2 is rotatably arranged on the support mechanism 1, wherein the support mechanism 1 is configured to realize the accurate positioning of the cleaning mechanism 2 relative to the semiconductor etching machine 200, and the support mechanism 1 ensures the smoothness of the rotation of the cleaning mechanism 2; and at least one cleaning unit 3 is arranged on the cleaning mechanism 2. With the rotation of the cleaning mechanism 2 on the support mechanism 1, the cleaning unit 3 uniformly cleans and maintains the electrostatic chuck 201.

In the process of practical application, the support mechanism 1 is fixed on the outer base of the electrostatic chuck 201 of the semiconductor etching machine 200, and at least one cleaning unit 3 is driven to rotate by rotating the cleaning mechanism 2 to clean the electrostatic chuck 201 of the semiconductor etching machine 200. The positioning function of the support mechanism 1 is used to ensure the stability of the cleaning mechanism 2 during rotation, thereby the stability and uniformity of the operation of the cleaning unit 3 are ensured, avoiding collision with other parts of semiconductor etching machine 200, which reduces the probability of damage to the parts of the semiconductor etching machine 200 due to cleaning and maintenance, reduces the replacement frequency of equipment parts, production costs, and downtime of the equipment, and ensures the production efficiency.

Figure 2:
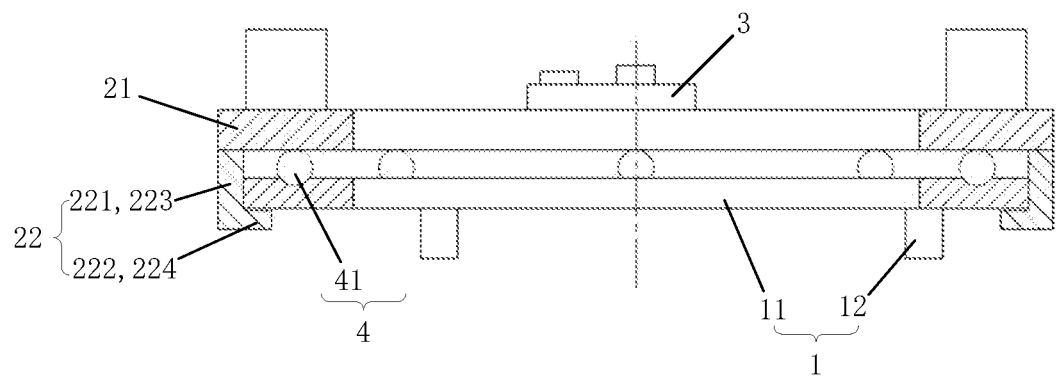
FIG. 2 is a schematic longitudinal sectional view of a fixture provided by an exemplary embodiment.

FIG. 2 is a schematic longitudinal sectional view of an exemplary embodiment of the fixture 100 of the present disclosure. As shown in FIG. 2, the cleaning mechanism 2 includes: a rotating unit 21 and a limiting unit 22; wherein the rotating unit 21 is rotatably arranged on the support mechanism 1, the cleaning unit 3 is arranged on the rotating unit 21; and the limiting unit 22 is detachably connected with the rotating unit 21 and is configured to limit the relative position of the rotating unit 21 and the support mechanism 1, so as to ensure that the center of the rotation track of the rotating unit 21 is always coaxial with the center of the support mechanism 1 when the rotating unit 21 drives the cleaning unit 3 to rotate. Thus, the operation stability of the cleaning mechanism 2 and the uniformity of cleaning the electrostatic chuck by the cleaning unit 3 are ensured, which effectively avoids the collision between the cleaning mechanism 2 and the cleaning unit 3 and other parts of the semiconductor etching machine 200 during rotation, thereby avoiding the damage to equipment parts caused by cleaning and maintenance, reducing the replacement frequency of parts of the semiconductor etching machine 200, shorten the shutdown time, reducing the production cost and improving the production efficiency.

In this solution, the support mechanism 1 includes: an annular support unit 11 and a connection unit 12 arranged at the bottom of the annular support unit 11; wherein the annular support unit 11 is configured to be sleeved on the outside of the electrostatic chuck 201 of the semiconductor etching machine 200, the rotating unit 21 is rotatably arranged on the annular support unit 11, and the center of the rotation track of the rotating unit 21 during rotation is in the same straight line with the central axis of the annular support unit 11; and the connection unit 12 is configured to fix the annular support unit 11 on the semiconductor etching machine 200, and ensures the installation stability of the annular support unit 11, so as to ensure the installation and operation stability of the fixture 100 on the semiconductor etching machine 200. In some embodiments, one end of the connection unit 12 is detachably connected with the annular support unit 11, and the other end of the connection unit 12 is arranged on the outer base of the electrostatic chuck 201 of the semiconductor etching machine 200. The connection unit 12 may be a connecting structure, for example, an arc connector with a certain length; the connection unit 12 can also be multiple connecting parts, for example, two or more connecting columns.

In some embodiments, in order to simplify the installation structure and save cost of the fixture 100, the original structure of the semiconductor etching machine 200 can be fully used to connect with the support mechanism 1 of the fixture 100. Exemplarily, the support mechanism 1 can be fixed and installed by the original process holes on the outer base of the electrostatic chuck 201 of the semiconductor etching machine 200. For example, the connection units 12 are columnar structure adapted to the process holes. The columnar connection units 12 are arranged correspondingly and distributed according to the position of the process holes on the outer base of the electrostatic chuck 201 at the bottom of the support mechanism 1. During installation, the connection units 12 of the columnar structure are installed one by one into the process holes on the outer base of the electrostatic chuck 201. The positioning and installation of the support mechanism 1 are realized, that is, the positioning and installation of the fixture 100 on the semiconductor etching machine 200 are realized.

Figure 3:
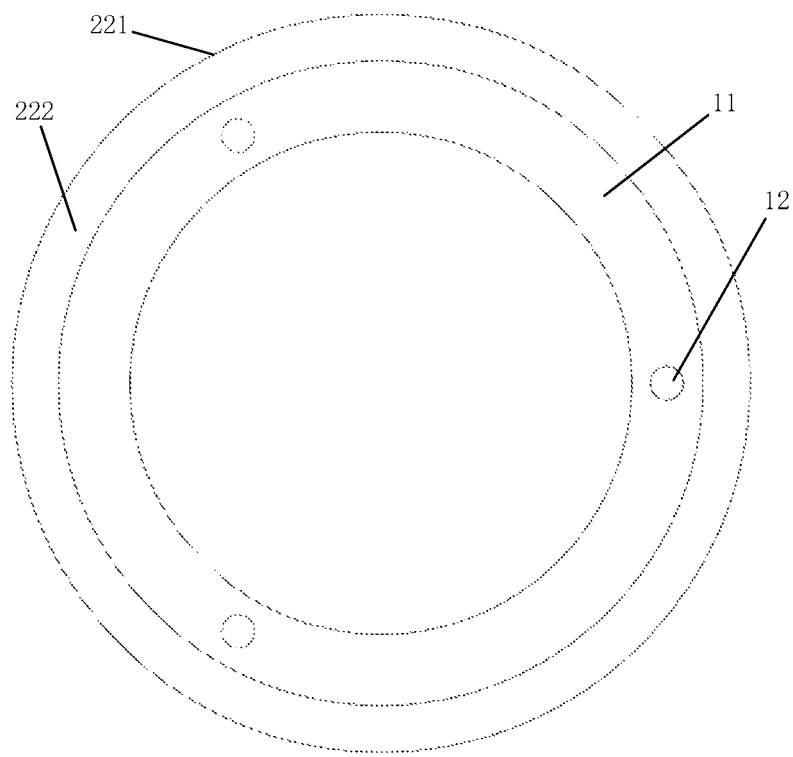
FIG. 3 is a bottom view of a fixture provided by an exemplary embodiment.

FIG. 3 shows a bottom view of an exemplary embodiment of the fixture 100 of the present disclosure. With comprehensive reference to FIGS. 2 and 3, in some embodiments, the limiting unit 22 includes: a limiting ring 221 and a first limiting member 222 arranged at the bottom of the limiting ring 221; wherein the limiting ring 221 is sleeved on the annular support unit 11, and one end of the limiting ring 221 is detachably connected with the rotating unit 21; and the other end of the limiting ring 221 is provided with a first limiting member 222 and the first limiting member 222 is located below the annular support unit 11. The radial limiting of the rotating unit 21 is realized by the limiting ring 221, and the axial limiting of the rotating unit 21 can be realized by the first limiting member 222. The limiting ring 221 and the first limiting member 222 jointly ensure the operation stability of the rotating unit 21 during rotation, and ensure that the center of the rotation track of the rotating unit 21 is in the same straight line with the central axis of the annular support unit 11, and ensure that the rotation track of the rotating unit 21 is determined and accurate, so as to avoid the collision between the fixture 100 and the semiconductor etching machine 200 during cleaning, and avoid unnecessary damage to the parts of the equipment.

In an exemplary embodiment, as shown in FIG. 3, the first limiting member 222 may be an annular plate structure fixedly connected with the limiting ring 221 at 90 degrees. In the installation state, an annular slot is formed between the first limiting member 222, the limiting ring 221 and the rotating unit 21, and the edge of the annular support unit 11 or the annular support unit 11 is located in the annular slot to ensure the accurate positioning between the rotating unit 21 and the annular support unit 11 and ensure the stable running track of the rotating unit 21, Thus, the cleaning uniformity of the cleaning unit 3 is ensured.

Figure 4:
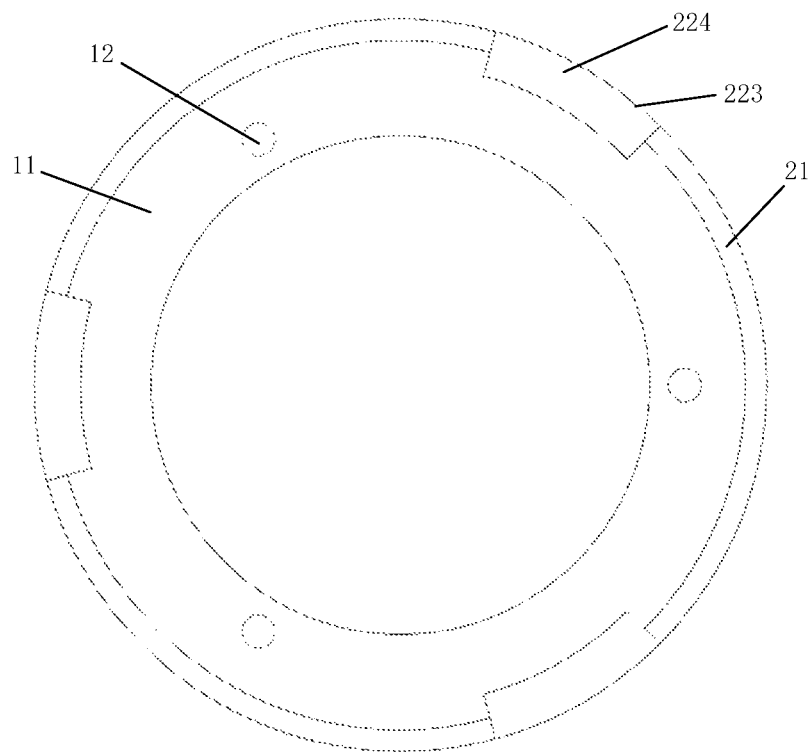
FIG. 4 is another bottom view of a fixture provided by an exemplary embodiment.

FIG. 4 shows a bottom view of another exemplary embodiment of the fixture 100 of the present disclosure. With comprehensive reference to FIGS. 2 and 4, in some embodiments, the limiting unit 22 includes at least three limiting parts 223, and the bottom end of each limiting part 223 is provided with at least one second limiting member 224. In the embodiment shown in FIG. 4, the limiting unit 22 includes three limiting parts 223, and a second limiting member 224 is arranged at the bottom of each limiting part 223. The three limiting parts 223 are distributed at intervals on the outside of the annular support unit 11, one end of the limiting part 223 is detachably connected with the rotating unit 21, the other end of the limiting part 223 is provided with a second limiting member 224, and the second limiting member 224 is located below the annular support unit 11. The rotating unit 21 and the annular support unit 11 are radially limited by the three limiting parts 223 with interval distribution, and then the rotating unit 21 and the annular support unit 11 are axially limited by the second limiting member 224, so as to ensure the stability of the relative position in the radial and axial directions between the rotating unit 21 and the annular support unit 11, that is, ensuring the operation stability of the rotating unit 21 during rotation, ensuring that the rotation track of the rotating unit 21 is determined and accurate, and then the collision between the fixture 100 and the semiconductor etching machine 200 is avoided during cleaning, so as to avoid unnecessary damage to the parts of the equipment.

In an exemplary embodiment, as shown in FIG. 4, the limiting part 223 is an arc-shaped limiting part, and the second limiting member 224 is an arc-shaped flat plate structure, which is fixedly connected with the limiting part 223 at 90 degrees. An arc-shaped slot is formed between each limiting part 223 and second limiting member 224 and the rotating unit 21. The annular support unit 11 or the edge of the annular support unit 11 is located in the arc-shaped slot. The radial and axial limits between the rotating unit 21 and the annular support unit 11 are realized by three groups of arc-shaped slots to ensure the accurate positioning and stable rotation of the rotating unit 21, thus, the cleaning uniformity of the cleaning unit 3 is ensured.

As shown in FIG. 2-FIG. 4, in other embodiments, the limiting unit 22 may also be a combined structure of at least three limiting parts 223 and the annular first limiting member 222, or a combined structure of the limiting ring 221 and at least three second limiting members 224, wherein the combined structure is able to limit the radial and axial positions between the rotating unit 21 and the annular support unit 11 at the same time. Meanwhile, it is necessary to avoid collision between the outer periphery of the limiting unit 22 and the semiconductor etching machine 200 during the rotation of the rotating unit 21. Therefore, the outer wall of the limiting ring 221 or the limiting part 223 is an arc structure, and in the installation state, a certain gap is necessary between the outer wall of the limiting ring 221 and the semiconductor etching machine 200 or between the outer wall of the limiting part 223 and the semiconductor etching machine 200.

Referring to FIG. 2, in the solution of the present disclosure, the fixture 100 also includes a rotating mechanism 4, the rotating mechanism 4 is located between the cleaning mechanism 2 and the support mechanism 1, and is configured to ensure the smoothness of the rotation of the cleaning mechanism 2. Exemplarily, the rotating mechanism 4 is arranged between the rotating unit 21 and the annular support unit 11, so that the rotating unit 21 rotates smoothly relative to the annular support unit 11.

In some embodiments, the rotating mechanism 4 includes a plurality of balls 41 arranged between the annular support unit 11 and the rotating unit 21. A plurality of balls 41 with the same diameter are configured to support the rotating unit 21 and ensure the smoothness and stability of the rotating operation of the rotating unit 21.

Figure 5:
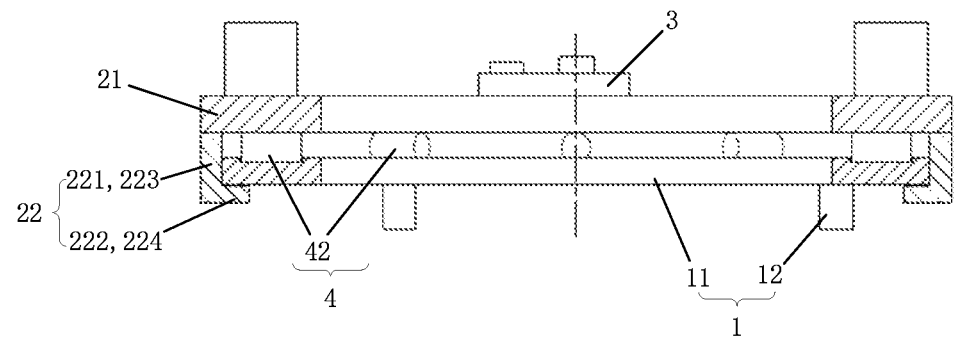
FIG. 5 is a schematic longitudinal sectional view of a fixture provided by an exemplary embodiment.

FIG. 5 is a schematic longitudinal sectional view of the fixture 100 provided by an exemplary embodiment. As shown in FIG. 5, in some embodiments, the rotating mechanism 4 includes a plurality of rollers 42 arranged between the annular support unit 11 and the rotating unit 21, the rolling of a plurality of rollers 42 with the same diameter are configured to ensure the smoothness and stability of the rotation of the rotating unit 21. Wherein the axial direction of the roller 42 is parallel to the radial direction of the annular support unit 11, that is, one ends of the plurality of rollers 42 are arranged in the direction of the central axis of the annular support unit 11, and the central axis of the roller 42 is arranged parallel to the upper surface of the annular support unit 11 to ensure smooth rotation of the rotating unit 21 without getting stuck.

Figure 6:
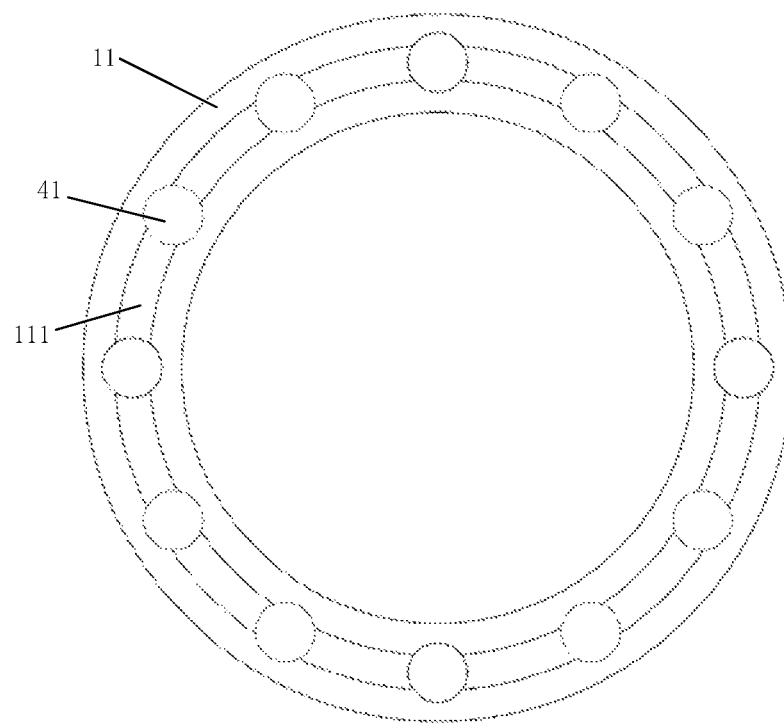
FIGS. 6-8 are top schematic diagrams of a support mechanism provided by an exemplary embodiment.
Figure 7:
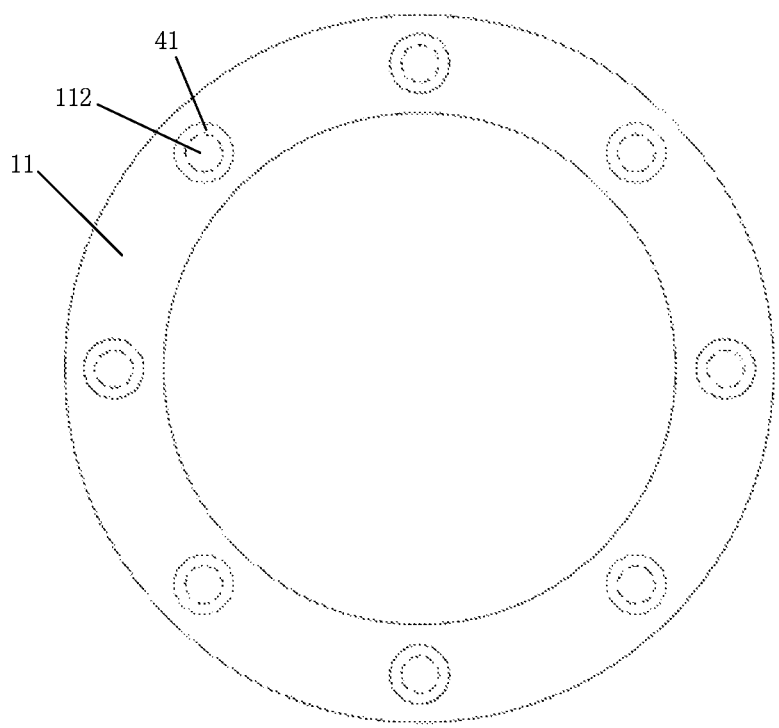
Figure 8:
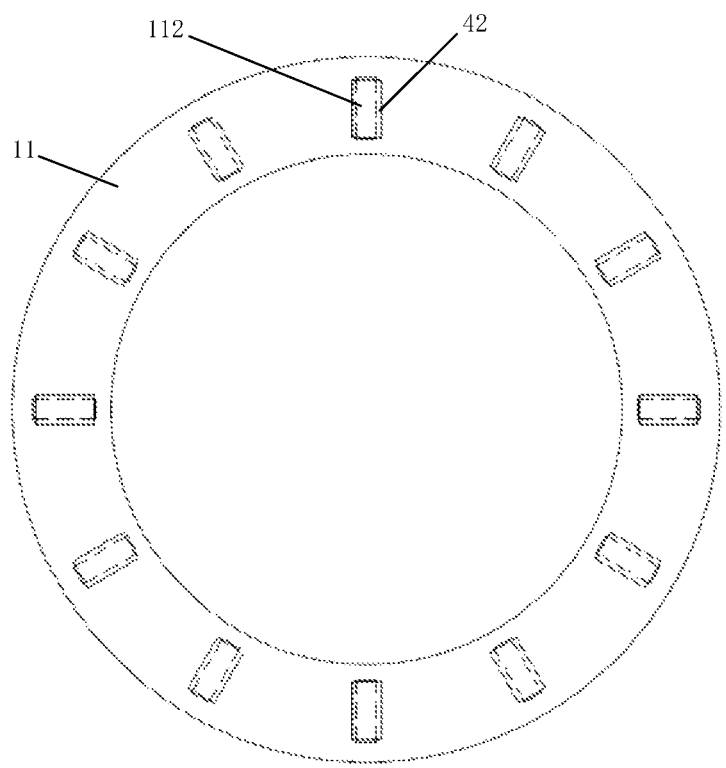

FIGS. 6-8 are top schematic diagrams of the support mechanism 1 in an exemplary embodiment, respectively showing the position of the rotating mechanism 4 on the annular support unit 11 of the support mechanism 1 in one embodiment. In the embodiments shown in FIGS. 6 and 7, the rotating mechanism 4 includes a plurality of balls 41; and in the embodiment shown in FIG. 8, the rotating mechanism 4 includes a plurality of rollers 42.

In order to improve the rotation stability of the rotating unit 21, the rotating mechanism 4 needs to be limited between the rotating unit 21 and the annular support unit 11. In some embodiments, as shown in FIG. 6, an annular rolling slot 111 is arranged on the annular support unit 11. A plurality of balls 41 are arranged in the annular rolling slot 111, and a limit and rolling track are provided for the balls 41 by the annular rolling slot 111. The balls 41 roll in the annular rolling slot 111, which can ensure the smoothness and stability of the rotation of the rotating unit 21. Exemplarily, the longitudinal section of the annular rolling slot 111 is an arc, and the arc radius of the longitudinal section of the annular rolling slot 111 is greater than or equal to the radius of the ball 41. In the embodiment shown in FIG. 6, the width of the annular rolling slot 111 is less than the diameter of the ball 41, and the depth of the annular rolling slot 111 is less than the radius of the ball 41. In other embodiments, the depth of the annular rolling slot 111 may be equal to or greater than the radius of the ball 41, and just less than the diameter of the ball 41. Moreover, the width of the annular rolling slot 111 may also be set equal to or greater than the diameter of the ball 41.

In other embodiments, as shown in FIGS. 7 and 8, a plurality of limiting slots 112 are arranged on the annular support unit 11, a plurality of balls 41 (FIG. 7) or a plurality of rollers 42 (FIG. 8) are respectively arranged in the plurality of limiting slots 112, and the dotted line in the figure shows the boundary line of the limiting slots 112.

In the embodiment shown in FIG. 7, the rotating mechanism 4 includes eight balls 41. Eight limiting slots 112 of spherical structure are arranged on the annular support unit 11, wherein each ball 41 is located in one limiting slot 112, and the ball 41 can roll smoothly in the limiting slot 112 of spherical structure, so as to ensure the smoothness of the rotation of the rotating unit 21, and then, the smoothness of the rotation of the rotating unit 21 on the annular support unit 11 is ensured. It should be noted that the spherical radius of the limiting slot 112 should be greater than or equal to the radius of the ball 41 to ensure the smoothness of the rotation of the ball 41 in the limiting slot 112. Exemplarily, the depth of the limiting slot 112 may be less than the radius of the ball 41 (as shown in FIG. 7), or equal to or greater than the radius of the ball 41, and just less than the diameter of the ball 41, so as to avoid the direct contact between the rotating unit 21 and the annular support unit 11 affecting the smoothness of the rotation of the rotating unit 21.

In the embodiment shown in FIG. 8, the rotating mechanism 4 includes 12 columnar rollers 42. Correspondingly, 12 limiting slots 112 are arranged on the annular support unit 11, wherein each roller 42 is located in one limiting slot 112. The axial direction of each roller 42 is parallel to the radial direction of the annular support unit 11, that is, the central axes of the 12 rollers 42 converge at an intersection, and the intersection is in the same line with the central axis of the annular support unit 11. When the rotating unit 21 rotates, the rollers 42 rotate around their axis in the limiting slot 112, so as to realize the rotation of the rotating unit 21 and ensure the smoothness and stability of the rotating operation of the rotating unit 21.

With comprehensive reference to FIGS. 5 and 8, in such embodiments, in order to ensure the smoothness of the roller 42 rolling in the limiting slot 112, the inner surface of the limiting slot 112 is a cylindrical structure, and the radius of the cylindrical structure is greater than or equal to the radius of the roller 42, and the length of the limiting slot 112 is greater than or equal to the length of the roller 42. It should be noted that the depth of the limiting slot 112 can be less than the radius of the roller 42 (as shown in FIG. 8), or greater than or equal to the radius of the roller 42, just less than the diameter of the roller 42, so as to ensure that there is always a certain gap between the rotating unit 21 and the annular support unit 11, this prevents the friction force between the rotating unit 21 and the annular support unit 11 after the rotating unit 21 is in direct contact with the annular support unit 11 from hindering the rotation of the rotating unit 21. Exemplarily, the width of the limiting slot 112 may be set to be less than or equal to the diameter of the roller 42 or set to be greater than the diameter of the roller 42.

In other embodiments, the rotating mechanism 4 may also be arranged between the annular support unit 11 and the limiting unit 22, for example, between the outer periphery of the annular support unit 11 and the inner wall of the limiting ring 221. Exemplarily, an annular slot is arranged between the outer periphery of side wall of the annular support unit 11 and the inner wall of the limiting ring 221, a plurality of limiting holes are arranged on the inner wall of the limiting ring 211, wherein balls are arranged in the limiting holes, and the balls are also located in the annular slot. So that the rotation of the limiting ring 221 is realized by a plurality of balls between the annular support unit 11 and the limiting ring 221, further, the limiting ring 221 can drive the rotating unit 21 rotating along the annular slot on the annular support unit 11 to realize the smooth rotation of the rotating unit 21 and drive the cleaning unit 3 to operate smoothly.

In other embodiments, the rotation structure is configured to ensure the smooth rotation of the rotating unit 21 along the annular support unit 11, the rotation structure can also refer to the realizable plane bearing structure.

Figure 9:
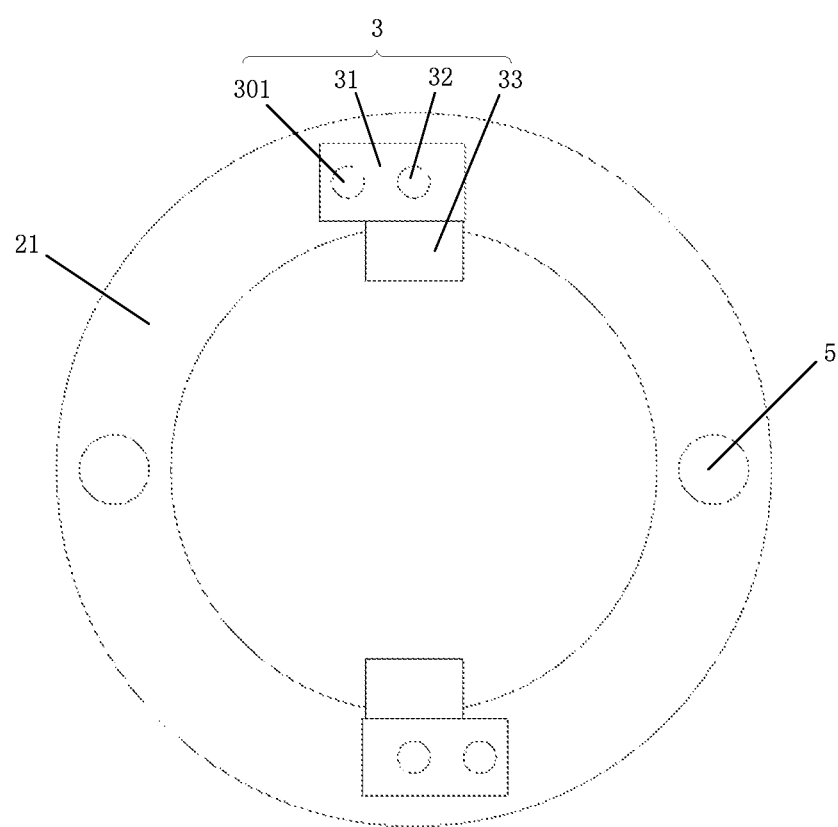
FIG. 9 is a schematic top view of a fixture provided by an exemplary embodiment.

FIG. 9 is a top view of the fixture 100 of the present solution according to an exemplary embodiment. As shown in FIG. 9, in the fixture 100 of the present disclosure, the cleaning unit 3 includes: a support part 31 and a positioning part 32; wherein the support part 31 rotatably arranged on the rotating unit 21, and the positioning part 32 is configured to position the support part 31 at a preset position. Exemplarily, the support part 31 is rotatably arranged on the rotating unit 21 by means of the rotating shaft 301.

It should be noted that in the present disclosure, the cleaning unit 3 also includes a cleaning part 33. The cleaning part 33 is located between the support part 31 and the rotating unit 21. And the cleaning part 33 is fixed at a preset position of the rotating unit 21 by the support part 31 and the positioning part 32, and cleans the equipment with the rotation of the rotating unit 21. Exemplarily, the cleaning part 33 can be sandpaper, such as 3M sandpaper, ethanol cloth, or other cleaning cloth or paper that contains or does not contain organic solvents.

In practical application, the cleaning part 33 may not be installed before the fixture 100 is installed on the semiconductor etching machine 200. In the process of installing the fixture 100 on the semiconductor etching machine 200, the support part 31 needs to be fixed by the positioning part 32, so as to avoid the support part 31 colliding with the semiconductor etching machine 200 due to the unpositioned rotation of the support part 31 during the installation process, thereby, preventing the support part 31 from damaging the parts of the semiconductor etching machine 200. After installing the support mechanism 1 on the semiconductor etching machine 200, loosen the installation force of the positioning part 32, turn the support part 31 to one side or lift it, and place the cleaning part 33 on the rotating unit 21, and the edge of the cleaning part 33 exceeds the predetermined range of the inner edge of the rotating unit 21, then the support part 31 is rotated onto the cleaning part 33, and then, the support part 31 is fastened by the positioning part 32, and the cleaning part 33 is pressed on the rotating unit 21 to complete the installation and positioning of the support part 31 and the cleaning part 33, so as to ensure that the cleaning part 33 can move with the rotation of the rotating unit 21, and clean the electrostatic chuck 201 of the semiconductor etching machine 200 during the movement.

In some embodiments, in order to avoid collision between the support part 31 and parts (especially the electrostatic chuck 201) of the semiconductor etching machine 200 during the rotation of the rotating unit 21, the inner edge of the support part 31 is adapted to the inner edge of the rotating unit 21, and the outer edge of the support part 31 is also adapted to the outer edge of the rotating unit 21 when the support part 31 is positioned at a preset position. For example, the inner edge of the support part 31 may be an arc structure with the same shape and radius as the inner edge of the rotating unit 21, or a flush structure as shown in FIG. 9, it is only necessary to ensure that the inner edge of the support part 31 does not exceed the edge range of the rotating unit 21. Correspondingly, the outer edge of the support part 31 may also be set not to exceed the outer edge of the rotating unit 21. For example, the outer edge of the support part 31 may be set as a flush structure or an arc structure as shown in FIG. 9.

In some embodiments, at least one cleaning unit 3, the number of cleaning unit 3 may be one or a plurality. When a plurality of cleaning units 3 are provided, the plurality of cleaning units 3 can be arranged at equal intervals or unequal intervals. In the embodiment shown in FIG. 9, two cleaning units 3 are arranged on the cleaning mechanism 2, and the two cleaning units 3 are distributed on the rotating unit 21 at equal intervals.

In order to facilitate operation, the fixture 100 of the present disclosure also includes at least one operation part 5 to facilitate holding the fixture 100 and manual operation to drive the cleaning mechanism 2 to rotate. In order to facilitate disassembly and operation, the operation part 5 is detachably arranged on the cleaning mechanism 2. Exemplarily, in the present embodiment, the operation part 5 is detachably connected to the upper surface of the rotating unit 21. In other embodiments, the operation part 5 may also be detachably connected to the edge of the rotating unit 21 or fixedly connected or detachably connected with the limiting unit 22.

In some embodiments, the operation part 5 is an operation handle. For example, in the present embodiment, the operation part 5 is a columnar operation handle. In practical application, the material of the operating handle can be set according to the actual situation. For example, it can be coated with a layer of rubber to improve the comfort of operation.

The embodiments or implementations in this specification are described in a progressive manner, each embodiment focuses on the differences from other embodiments, and the same or similar parts between the various embodiments may be referred to each other.

In the description of this specification, the descriptions with reference to the terms "embodiment", "exemplary embodiment", "some implementations", "schematic implementation", "example", etc. mean that specific features, structures, materials or characteristics described in conjunction with the embodiments or examples are included in at least one embodiment or example of the present disclosure.

In this specification, the schematic descriptions of the above terms do not necessarily refer to the same embodiment or example. Moreover, the described specific features, structures, materials or characteristics can be combined in an appropriate manner in any one or more embodiments or examples.

In the description of the present disclosure, it should be noted that the orientations or positional relationships indicated by the terms "center", "upper", "lower", "left", "right", "vertical", "horizontal", "inner", "outer", etc. are based on the orientations or positional relationships shown in the accompanying drawings, and are intended to facilitate the description of the present disclosure and simplify the description only, rather than indicating or implying that the device or element referred to must have a particular orientation or be constructed and operated in a particular orientation, and will not to be interpreted as limiting the present disclosure.

It can be understood that the terms "first", "second", etc. used in the present disclosure can be used in the present disclosure to describe various structures, but these structures are not limited by these terms. These terms are only used to distinguish the first structure from another structure.

In one or more drawings, the same elements are represented by similar reference numerals. For the sake of clarity, various parts in the drawings are not drawn to scale. In addition, some well-known parts may not be shown. For the sake of brevity, the structure obtained after several steps can be described in one figure. Many specific details of the present disclosure are described below, such as the structure, material, dimension, treatment process and technology of devices, in order to understand the present disclosure more clearly. However, as those skilled in the art can understand, the present disclosure may not be implemented according to these specific details.

Finally, it should be noted that the above embodiments are merely used to describe, but not to limit, the technical solutions of the present disclosure. Although the present disclosure is described in detail with reference to the above embodiments, those of ordinary skill in the art should understand that various modifications may be made to the technical solutions described in the foregoing embodiments, or equivalent substitutions may be made to some or all technical features thereof, and these modifications or substitutions do not make the essences of the corresponding technical solutions depart from the scope of the technical solutions of the embodiments of the present disclosure.

INDUSTRIAL APPLICABILITY

The embodiment of the present disclosure provides a fixture. The fixture being applied to the semiconductor etching machine, can replace manual operation, reduce staffing, solve the inconsistency and imbalance caused by manual operation, and also solve the problem of parts damage caused by improper manual operation, which greatly reduces the risk of parts damage and reduces the increase in costs caused by updating parts, reduces the production costs, meanwhile, it reduces equipment downtime, improves the normal operation time of the equipment and improves the production capacity.

The invention claimed is:

1. A fixture, the fixture is a fixture for a semiconductor etching machine, the fixture comprises:
   a support mechanism, configured to be arranged on an outer base of an electrostatic chuck of the semiconductor etching machine;
   a cleaning mechanism, being rotatably arranged on the support mechanism; and
   at least one cleaning unit, being arranged on the cleaning mechanism;
   wherein the cleaning mechanism comprises:
   a rotating unit, being rotatably arranged on the support mechanism, and the cleaning unit being arranged on the rotating unit; and
   a limiting unit, being detachably connected with the rotating unit and configured to limit a relative position of the rotating unit and the support mechanism;
   wherein the support mechanism comprises:
   an annular support unit, configured to be sleeved on an outside of the electrostatic chuck of the semiconductor etching machine, and the rotating unit being rotatably arranged on the annular support unit; and
   a connection unit, one end of the connection unit being detachably connected with the annular support unit, and the other end of the connection unit being arranged on the outer base of the electrostatic chuck of the semiconductor etching machine;
   wherein the cleaning unit comprises:
   a support part, being rotatably arranged on the rotating unit; and
   a positioning part, configured to position the support part at a preset position;
   wherein the limiting unit comprises:
   a limiting ring, wherein the limiting ring is sleeved on the annular support unit, and one end of the limiting ring is detachably connected with the rotating unit; and the other end of the limiting ring is provided with a first limiting member, the first limiting member is located below the annular support unit.

2. The fixture according to claim 1, wherein the first limiting member is an annular plate and the first limiting member is fixedly connected with the limiting ring at 90 degrees.

3. The fixture according to claim 1, further comprising: a rotating mechanism, being arranged between the rotating unit and the annular support unit to rotate the rotating unit relative to the annular support unit.

4. The fixture according to claim 3, wherein the rotating mechanism comprises:
   a ball; or
   a roller, an axial direction of the roller is parallel to a radial direction of the annular support unit.

5. The fixture according to claim 4, wherein an annular rolling slot or a plurality of limiting slots are arranged on the annular support unit, and a plurality of the balls or a plurality of the rollers are located in the annular rolling slot or the plurality of limiting slots.

6. The fixture according to claim 1, wherein when the support part is positioned at the preset position, an inner edge of the support part is adapted to an inner edge of the rotating unit.

7. The fixture according to claim 1, further comprising:
at least one operation part, being detachably connected to the cleaning mechanism.

8. The fixture according to claim 1, wherein the at least one cleaning unit comprise a plurality of cleaning units, and the plurality of cleaning units are arranged at equal intervals.

9. A fixture, the fixture is a fixture for a semiconductor etching machine, the fixture comprises:
a support mechanism, configured to be arranged on an outer base of an electrostatic chuck of the semiconductor etching machine;
a cleaning mechanism, being rotatably arranged on the support mechanism; and
at least one cleaning unit, being arranged on the cleaning mechanism;
wherein the cleaning mechanism comprises:
a rotating unit, being rotatably arranged on the support mechanism, and the cleaning unit being arranged on the rotating unit; and
a limiting unit, being detachably connected with the rotating unit and configured to limit a relative position of the rotating unit and the support mechanism;
wherein the support mechanism comprises:
an annular support unit, configured to be sleeved on an outside of the electrostatic chuck of the semiconductor etching machine, and the rotating unit being rotatably arranged on the annular support unit; and
a connection unit, one end of the connection unit being detachably connected with the annular support unit, and the other end of the connection unit being arranged on the outer base of the electrostatic chuck of the semiconductor etching machine;
wherein the cleaning unit comprises:
a support part, being rotatably arranged on the rotating unit; and
a positioning part, configured to position the support part at a preset position;
wherein the limiting unit comprises:
a limiting part, wherein the limiting part is arranged at intervals on an outside of the annular support unit, one end of the limiting part is detachably connected with the rotating unit, the other end of the limiting part is provided with a second limiting member, and the second limiting member is located below the annular support unit.

10. The fixture according to claim 9, wherein the limiting part is an arc-shaped limiting part, and the second limiting member is an arc-shaped flat plate structure, the second limiting member is fixedly connected with the limiting part at 90 degrees.

11. The fixture according to claim 9, further comprising:
a rotating mechanism, being arranged between the rotating unit and the annular support unit to rotate the rotating unit relative to the annular support unit.

12. The fixture according to claim 11, wherein the rotating mechanism comprises:
a ball; or
a roller, an axial direction of the roller is parallel to a radial direction of the annular support unit.

13. The fixture according to claim 12, wherein an annular rolling slot or a plurality of limiting slots are arranged on the annular support unit, and a plurality of the balls or a plurality of the rollers are located in the annular rolling slot or the plurality of limiting slots.

14. The fixture according to claim 9, wherein when the support part is positioned at the preset position, an inner edge of the support part is adapted to an inner edge of the rotating unit.

15. The fixture according to claim 9, further comprising:
at least one operation part, being detachably connected to the cleaning mechanism.

16. The fixture according to claim 9, wherein at least one cleaning unit comprise a plurality of cleaning units, and the plurality of cleaning units are arranged at equal intervals.

17. A fixture, the fixture is a fixture for a semiconductor etching machine, the fixture comprises:
a support mechanism, configured to be arranged on an outer base of an electrostatic chuck of the semiconductor etching machine;
a cleaning mechanism, being rotatably arranged on the support mechanism; and
at least one cleaning unit, being arranged on the cleaning mechanism;
wherein the cleaning mechanism comprises:
a rotating unit, being rotatably arranged on the support mechanism, and the cleaning unit being arranged on the rotating unit; and
a limiting unit, being detachably connected with the rotating unit and configured to limit a relative position of the rotating unit and the support mechanism;
wherein the support mechanism comprises:
an annular support unit, configured to be sleeved on an outside of the electrostatic chuck of the semiconductor etching machine, and the rotating unit being rotatably arranged on the annular support unit; and
a connection unit, one end of the connection unit being detachably connected with the annular support unit, and the other end of the connection unit being arranged on the outer base of the electrostatic chuck of the semiconductor etching machine;
wherein the cleaning unit comprises:
a support part, being rotatably arranged on the rotating unit; and
a positioning part, configured to position the support part at a preset position;
wherein the fixture further comprising:
a rotating mechanism, being arranged between the rotating unit and the annular support unit to rotate the rotating unit relative to the annular support unit;
wherein the rotating mechanism comprises:
a ball; or
a roller, an axial direction of the roller is parallel to a radial direction of the annular support unit;
wherein an annular rolling slot or a plurality of limiting slots are arranged on the annular support unit, and a plurality of the balls or a plurality of the rollers are located in the annular rolling slot or the plurality of limiting slots.

18. The fixture according to claim 17, wherein when the support part is positioned at the preset position, an inner edge of the support part is adapted to an inner edge of the rotating unit.

19. The fixture according to claim 17, further comprising:
at least one operation part, being detachably connected to the cleaning mechanism.

20. The fixture according to claim 17, wherein the at least one cleaning unit comprise a plurality of cleaning units, and the plurality of cleaning units are arranged at equal intervals.

* * * * *